United States Patent [19]

Pedro

[11] 4,158,876
[45] Jun. 19, 1979

[54] CIRCUIT BOARD HOLDER
[75] Inventor: Alfred J. Pedro, St. Paul, Minn.
[73] Assignee: Carl Pedro and Sons, Inc., St. Paul, Minn.
[21] Appl. No.: 875,596
[22] Filed: Feb. 6, 1978
[51] Int. Cl.$^2$ ............................................. H02B 1/02
[52] U.S. Cl. ...................................... 361/415; 211/41
[58] Field of Search .......................... 361/415; 211/41; 312/257 M, 257 A; 206/334, 564

[56] References Cited
U.S. PATENT DOCUMENTS

| | | | |
|---|---|---|---|
| 3,271,626 | 9/1966 | Howrilica | 361/415 |
| 3,382,976 | 5/1968 | Novet | 361/415 |
| 3,407,938 | 10/1968 | Walter et al. | 361/415 |
| 3,915,307 | 10/1975 | Agarde | 211/41 |
| 4,006,388 | 2/1977 | Bartholomew | 361/415 |
| 4,029,208 | 6/1977 | Fickler et al. | 211/41 |

Primary Examiner—David Smith, Jr.
Attorney, Agent, or Firm—Jacobson and Johnson

[57] ABSTRACT

A circuit board holder having adjustable compartments for different size circuit boards with the walls of the compartments having a set of openings therein for fastening dividers thereto, each of the dividers having adjustable slots therein for positioning and attaching the dividers to the compartment walls and a guide for holding a circuit board in a spaced upright position in the compartment and a member that supports at least a portion of the circuit board in the compartment to prevent the circuit boards from falling out of the circuit board holder. The circuit board holder can be either installed in a carrying case or stacked on a shelf.

6 Claims, 2 Drawing Figures

CIRCUIT BOARD HOLDER

BACKGROUND OF THE INVENTION

1. Field of the Invention

This invention relates generally to holders, and more specifically, to a circuit board holder for use as a storage unit or in a carrying case to support and protect circuit boards of different sizes.

2. Description of the Prior Art

The concept of slotted holders for articles is well known in the art and many types of holders exist in the prior art. For example, the Kinsey U.S. Pat. No. 593,024 shows a holder for optical lenses having grooves for receiving the edges of the lenses.

The Kerstner U.S. Pat. No. 3,014,594 shows an adjustable groove fixture for holding card-like members at their ends.

The Kerschbaum U.S. Pat. No. 3,664,510 shows a card cage for printed circuits in which a flexible plastic member mounted in a metal frame securely and yieldably holds the circuit card in place.

The Stefanik U.S. Pat. No. 2,784,840 shows a salesman's sample tray for ceramic and other fragile objects in which foam rubber raised section provides holding surfaces for objects therein.

The Hedger U.S. Pat. No. 3,458,767 shows a rack for accommodating electrical circuit elements which have opposed rows of parallel guides into which the sides of the circuit elements can be slid. Hedger further includes edge connectors for engagement with the ends of the circuit elements which are retained in the rack as a group by retaining strips extending at right angles to the ends of the connectors.

These prior art holders are typical of the type of numerous devices used to hold circuit boards. The present invention comprises an improvement over the prior art circuit board holders by providing a circuit board holder that accommodates different size circuit boards. In addition, the circuit boards can be transported to and from a job in the holder by placing the holder in a carrying case or the holder can be used temporarily to store circuit boards in the container.

BRIEF SUMMARY OF THE INVENTION

Briefly, the present invention comprises a multipurpose circuit board holder having a rigid outer frame for protectively holding circuit boards therein. The interior walls have grooves for resiliently engaging the edges of a circuit board and adjustable dividers which are positionably at any distance intermediate the holder to accommodate different size circuit boards. Fastening members hold the container and divider as a rigid unit while a peripheral flange on the holder ensures that the circuit boards are held within the holder.

DESCRIPTION OF THE PREFERRED EMBODIMENT

Figure 1:
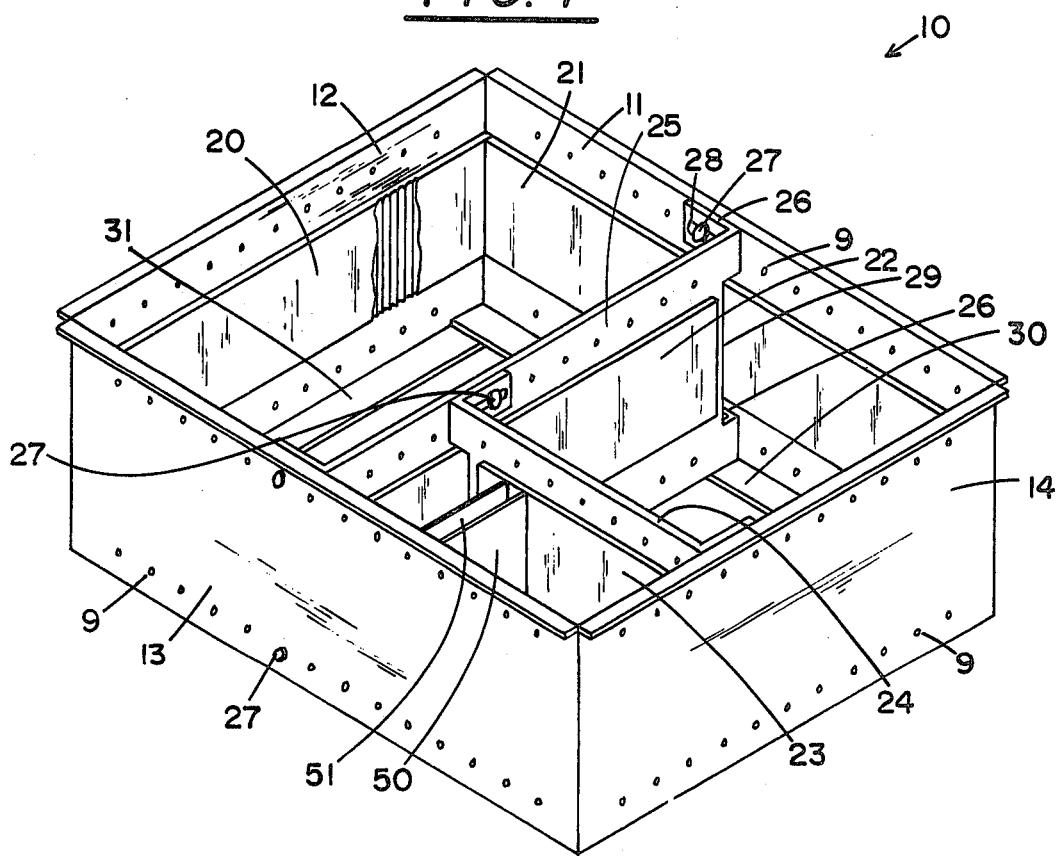
FIG. 1 is a pictorial view of the circuit board holder of the invention.

Referring to FIG. 1, reference numeral 10 generally designates the adjustable circuit board holder of the present invention. Adjustable circuit board holder 10 comprises a first side wall 11, a second side wall 12, a third side wall 13 and a fourth side wall 14 which are joined together at the ends to form a rectangular shaped frame which fits into a carrying case. In each of the walls there are two rows of holes which are designated by reference numeral 9. Typically, holes 9 are spaced approximately one inch apart. One row of holes runs along the top of each of the side walls and a second row along the bottom of each of the side walls with the holes in the top row being directly above the holes in the bottom row. Located intermediate of side wall 11 and side wall 13 is a first divider 25 that extends from side wall 13 to side wall 11. At each end of divider 25 is a notch 29 that fits around circuit board guides mounted to the side walls. Located on each end of divider 25 are flanges 26 which abut against the inside of the side wall 13. Top flange 26 has a slotted opening 28 therein which is slightly longer than the center distance between holes 9. The combination of the multiple spaced holes 9 and the length of slotted opening 28 allows divider 25 to be located any place intermediate of side walls 12 and side wall 14. The proper holes provide the first locating point and the elongated slots allow divider 25 to be slid to the proper position. A fastener 27 passes through slotted opening 28 in flange 26 and through opening 9. Identical fastener members are located at the bottom and at the opposite end of the divider 25 and will not be described herein. Flanges 26 and fasteners 27 coact to provide a secure and rigid connection of the divider 25 to side walls 11 and 13.

Figure 2:
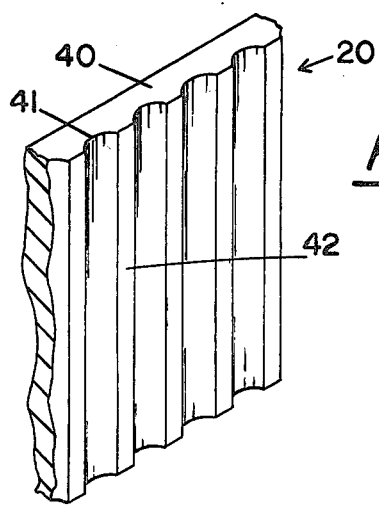
FIG. 2 is an enlarged view of the edge supporting section.

Located on side wall 11 is a circuit board guide 21 and located on side wall 12 is a circuit board guide 20. Similar circuit board guides are located on side wall 13 and side wall 14 (not shown). The circuit board guides extend through a notch 29 located in divider 25. The circuit board guide 20 is shown in more detail in FIG. 2 and comprises an elongated recess region 41 formed in a resilient base member 40. Located between elongated recess member 41 is a ridge 42 for maintaining the circuit boards in a spaced position. Typically, circuit board guide 12 can be permanently or temporarily fastened to wall 20 by an adhesive or the like.

Referring to FIG. 1, side wall 11 is shown with a lip 30 that projects inward and side wall 12 is shown with a lip 31 that also projects inward. Similarly, walls 13 and 14 have inwardly projecting lips (not shown). The retaining lip 30 coacts with the circuit board guide 21 and the circuit board guide on wall 13 to support and protect a circuit board in an upright spaced position within the circuit board holder 10.

To illustrate the adjustability of the circuit board holder for different size circuit boards, an adjustable divider 24 which is identical to divider 25 only shorter is fastened to divider 25 and wall 14 through flanges 26 and fastening members 27. A first circuit board 50 and a second circuit board 51 are shown held in vertical spaced position by a circuit board holder 23 and a circuit board holder located on wall 13 (not shown).

It is apparent that circuit boards of different size can be accommodated safely and efficiently in the present invention.

The circuit board holder 10 can be used as shown as a storage unit if desired or it can be placed into a carrying case to allow protection in transporting of the circuit board.

I claim:

1. A holder for circuit boards comprising a first wall having a plurality of spaced openings therein for attachment with a divider;

a second wall having a plurality of spaced openings therein for attachment with a divider;

further walls connecting said first wall to said second wall to produce a housing for supporting and protecting circuit boards located therein;

a first circuit board guide mounted to said first wall, said first circuit board guide having means projecting therefrom for holding circuit boards in an upright spaced condition;

a second circuit board guide mounted to said second wall, said second circuit board guide having means projecting therefrom for holding a circuit board in an upright spaced condition;

a lip extending from at least one of said walls to support a circuit board thereon;

a divider with two ends having flanges thereon for engaging with said first wall and said second wall so that said divider can be firmly connected to said first side walls and said second side walls, said divider having a notch at each end to permit said divider to fit over said means projecting from said circuit board guide; and fastening means for securely holding said divider to said first wall and said second wall.

2. The invention of claim 1 wherein said flanges have slots therein for receiving a fastening member.

3. The invention of claim 2 wherein said circuit board guide comprises a resilient material having elongated grooves therein for engaging a circuit board.

4. The invention of claim 3 wherein each of said walls includes an upper and lower row of spaced openings.

5. The invention of claim 4 wherein said flanges are at right angles to said divider.

6. The invention of claim 5 wherein said holder includes a second divider connected to said first divider and one of said walls.

* * * * *